United States Patent [19]

Hubert et al.

[11] 4,204,721
[45] May 27, 1980

[54] MANUFACTURE OF GAS FILLED ENVELOPES

[75] Inventors: Francois Hubert, Walcourt; Michel Laurent, Nivelles; Lucien Leger, Montigny-le-Tilleul, all of Belgium

[73] Assignee: B.F.G. Glassgroup, Paris, France

[21] Appl. No.: 952,128

[22] Filed: Oct. 17, 1978

[30] Foreign Application Priority Data

Oct. 25, 1977 [GB] United Kingdom ............... 44348/77

[51] Int. Cl.² ................................................ H01J 9/26
[52] U.S. Cl. ..................................... 316/19; 29/25.13; 29/469.5
[58] Field of Search ............................ 29/469.5, 25.13; 316/19

[56] References Cited

U.S. PATENT DOCUMENTS

| 3,807,833 | 4/1974 | Graham et al. | 29/25.13 |
| 3,939,556 | 2/1976 | Borel et al. | 316/19 |
| 4,029,371 | 6/1977 | Kupsky | 316/19 |

FOREIGN PATENT DOCUMENTS

| 210047 | 8/1956 | Australia | 316/19 |
| 2166229 | 3/1975 | France . | |

*Primary Examiner*—John McQuade
*Attorney, Agent, or Firm*—Cushman, Darby & Cushman

[57] ABSTRACT

A method of manufacturing a hermetically sealed envelope comprising assembling envelope-forming components of which at least one is a vitreous wall forming component wherein the or each vitreous component is metallized along a zone where it is to be bonded by solder to form a sealing joint. Such sealing is effected while the assembly 13 of envelope-forming components is within a hermetically sealable chamber 1 e.g. using heating devices 11, 12. The chamber may be evacuated via exhaust port 7 and valve 9 and optionally filled with a gas other than air via inlet port 4 and valve 6.

11 Claims, 5 Drawing Figures

MANUFACTURE OF GAS FILLED ENVELOPES

This invention relates to a method of manufacturing an envelope comprising at least one vitreous or partly vitreous wall, by assembling envelope-forming components at least one of which is a vitreous or partly vitreous wallforming component, and using a bonding medium to form at least one continuous peripheral joint between such components and thereby hermetically seal the envelope to enclose non-atmospheric gaseous conditions, the sealing being effected while the envelope is within an hermetically sealable chamber and after causing withdrawal of air from the envelope into such chamber.

BACKGROUND OF THE INVENTION

The manufacture of such envelopes is an important step in the manufacture of various kinds of electrical and electronic devices incorporating elements, energizable by electrical or electromagnetic signals. Such devices include for example display devices of gas-discharge and other types, electrical components comprising encapsulated microelectronic circuitry, semi-conductor devices, photovoltaic cells or photoresistive cells, and energy conversion devices such as devices with encapsulated solar cells.

Depending on the nature of the device, the gaseous substance to be sealed in the envelope may be a gas different in composition and/or pressure from the ambient atmosphere.

The employment of vitreous material in the manufacture of such envelopes is often necessary or desirable by reason of its chemical and physical properties. Transparent glass is a particularly advantageous material where transparency to light or other electromagnetic radiation is required, as for example in display devices and solar panels and other devices incorporating elements which must be effectively exposed to light or infrared radiation.

The hermetic sealing of one glass envelope component to another envelope component of glass or other material while the components are enclosed in an hermetically sealed chamber and the correct within-envelope environment is maintained, involves various problems. The chamber precludes access to the assembly for sealing it by hand. Heating of the assembled components to very high temperatures should be avoided. It would require large amounts of energy under those conditions, and in some cases devices enclosed in the envelope would be liable to be impaired.

French Pat. No. 2,166,229 describes a method of manufacturing the sealed glass envelope of a gas-discharge display panel wherein envelope components in the form of glass sheets are bonded together by means of a vitreous sealant. This sealant is applied in the form of a paste to the facing margins of the two sheets of glass, the sheets are assembled with an intervening spacer and placed in a vacuum chamber, the pressure in the chamber, and consequently in the envelope, is reduced to the required sub-atmospheric value, and the entire chamber is then heated in a furnace to about 500° C. to fuse the glass sealant so that it bonds the sheets together on cooling. This high temperature heating takes considerable time and would make the method unsuitable if devices susceptible to damage by heating to such higher temperatures had to be enclosed in the envelope.

U.S. Pat. No. 3,926,502 proposes to form a peripheral joint between vitreous envelope-forming components by means of a low-melting glass while leaving an opening via which evacuation of air and injection of a required fluid can take place, and to seal that opening after such injection by means of a low-melting metal. The evacuation and injection take place in a chamber sealed from atmosphere. There is no teaching how to locate and fuse the low-melting metal while the envelope is in the chamber.

U.S. Pat. No. 4,029,371 proposes employment of a glass sealant for forming a peripheral joint between envelope-forming components while leaving an opening via which air can be withdrawn from the envelope and replaced by another gas, and the subsequent sealing of said opening by a fusible glass plug having a softening point below that of the sealant used for the envelope joint. In order to permit the sealing up of the evacuation and gas-refill opening, the unsealed envelope is placed in an evacuation and refill chamber while orientated with the said opening uppermost and with the fusible glass plug resting in position over that opening. After establishing the correct gaseous environment in the envelope the plug is heated and fused in situ. Due to the assembly conditions required to supporting the plug preparatory to fusion and the difficulty of forming a reliable seal by fusion of a deposited solid glass plug, this method is not able to meet the requirements in view in making the present invention. There is moreover no teaching in the United States patent how the localised heating should be performed.

GENERAL DESCRIPTION OF THE INVENTION

It is an object of the invention to provide a method by which the sealed jointing of envelope-forming components in a sealed chamber enclosing non-atmospheric gaseous conditions can be more easily carried out.

According to the present invention, there is provided a method of manufacturing an envelope comprising at least one vitreous wall, by assembling envelope-forming components, at least one of which is a vitreous wall-forming component, and using a bonding medium to form at least one continuous peripheral joint between such components and thereby hermetically seal the envelope to enclose non-atmospheric gaseous conditions, the sealing being effected while the envelope is within an hermetically sealable chamber and after causing withdrawal of air from the envelope into such chamber, characterised in that the or each vitreous component is metallized along the zone where said bonding medium is to bond to such component and in that solder is used as the bonding medium for forming the or each said continuous peripheral joint.

The statement that the sealed envelope encloses non-atmospheric gaseous conditions means that the within-envelope environment is at a different pressure and/or of a different composition from the ambient atmosphere.

The solder used in carrying out the invention can have a melting point or melting range which is much below that of vitreous sealing compositions proposed in the prior art. The method according to the invention can therefore be performed quite cheaply, and in circumstances where such vitreous compositions could not be employed. The avoidance of intense heating is beneficial because display or other elements or materials which would be liable to be damaged by intense heating can be present in the envelope. Moreover heat sufficient for the soldering operation can be generated without need for the complicated measures for controlling the environmental conditions within the chamber which would be necessary if the chamber had to be heated to very high temperatures. Another advantage of the method according to the invention is that continuous joints of uniformly high quality can be formd notwithstanding that sealing takes place while the envelope-forming components are enclosed in a gas-tight chamber.

In preferred embodiments of the invention the heat required for gas-tightly sealing the envelope-forming components by means of solder is generated within the chamber itself and in the vicinity of such joint or joints. In this way the advantage of the method with regard to the ease with which sealing can be effected without great disturbance of the within-envelope environment is realised to the full extent.

According to a further preferred feature, all of the solder which is required for forming the continuous peripheral joint or joints is present as part of the assembly which is prepared for enclosure in the chamber. The sealing of the envelope within the chamber then takes place without the need for solder to be supplied extraneously, from within the chamber. Preferably the solder is present as one or more layers or strips extending along the continuous course of the required continuous airtight joint(s).

Preferably by peripheral joint or joints is or are formed entirely or substantially entirely within the chamber. This procedure enables the entire fabrication method to be performed in a particularly simple manner because the jointing of the components and the sealing of the envelope take place at one and the same stage, i.e. while the components are within the chamber. Another advantage of this procedure is that the withdrawal of air from the envelope (and if required its replacement by another gaseous medium) is facilitated because the interior of the envelope is in communication with the interior of the chamber around the entire periphery of the envelope.

When carrying out the invention in the foregoing manner, the envelope-forming components are preferably assembled with a supply of solder sandwiched between them along the continuous course of the required joint or joints, and the continuous gas-tight joint or joints is or are entirely or substantially entirely formed in the chamber by heating the solder in situ. Preferably this heating is effected by electrical heating means, e.g. by electrical resistance or induction heating. One or more soldering irons can be used as an alternative.

The quantity of solder which is sandwiched between juxtaposed envelope-forming components prior to the insertion of the assembly into the chamber may be adherent to one of such components, or part of such quantity may be adherent to one of such components and part to the other. Preferably the said quantity of solder is applied to the said component or components to form an adherent layer or layers along the continuous zone of the joint which is to be formed between them. As an alternative one or more strips or ribbons of solder can be clamped between the juxtaposed components. Such strip(s) or ribbon(s) can advantageously be spot-joined to the components(s) in order to hold the strip(s) or ribbon(s) in register.

In other methods within the scope of the invention the envelope-forming components are solder-jointed together before being enclosed in the chamber but so that there is a discontinuous peripheral joint and this is completed within the chamber after the required within-envelope environment has been established.

When carrying out the invention in the foregoing manner the solder-jointing of the components prior to their introduction into the chamber can be effected by any suitable soldering technique. Preferably the components and a supply of solder sufficient for the jointing operation are assembled with the solder disposed between the components and the jointing of the components is effected by heating solder in situ, e.g. by a flame or by electrical heating means. As an alternative, the initial jointing of the components can be effected by dip-soldering. Whichever method is selected for the jointing of the components before introduction into the chamber such jointing is preferably effected along nearly the whole of the periphery of the envelope so that the sealing step which is performed within the chamber can be confined to one or more local regions of the joint(s).

In carrying out the invention the or each vitreous wall-forming component is metallized along the continuous zone where the solder is required to bond to such component. The term vitreous used in this context includes a partly vitreous component, e.g., a component made of vitrocrystalline material obtained by thermal treatment of glass, or of a vitroceramic material formed by treatment of a particulate mineral feedstock to create a composition containing one or more vitreous phases.

The preparation of a vitreous or partially vitreous component for solder jointing can be in accordance with known practice in soldering glass components. According to a preferred procedure a marginal zone of the or each itreous component is metallised by evaporation coating in a vacuum r by using a spray gun. An alternative metallization technique which may be employed involves application of metal powder in a volatile liquid vehicle, forming e.g. a paste, and firing the coating to cause sintering of the metal powder in situ. A very satisfactory coating metal for forming the solder key is copper.

Preferably the solder employed as the bonding medium has a melting point or melting range below 350° C. and most preferably below 250° C. Advantageously the solder used is a lead/tin alloy, which optionally contains bismuth.

Alloys containing 60% to 35% lead (by weight) are particularly suitable so as to give a low melting point and low cost.

Tin-lead-bismuth solders when used preferably contain at least 15% tin and no more than 40% bismuth by weight.

The following are examples of solder compositions which have been found particularly suitable (parts by weight):

| Sn: | 63 | 60 | 50 | 23 | 42 | 46 |
| Pb: | 37 | 40 | 50 | 40 | 50 | 50 |
| Bi: | — | — | — | 37 | 8 | 4 |

Flux may be applied to those surfaces which are to be soldered together. This facilitates the formation of high quality solder joints. Preferably the flux used is a resin flux. Such fluxes have the advantage of being non-corrosive.

After completion of the sealing of an envelope by a method according to the invention, and withdrawal of the sealed envelope from the chamber, the solder joint(s) can if required to strengthened by applying further solder, e.g. by means of a solder jet or a soldering iron.

The invention can be applied for manufacturing envelopes of various forms, for example envelopes comprising front and rear walls which are directly bonded together at their margins, and envelopes comprising front and rear walls bonded to an intervening peripheral wall or spacer. Such a spacer may for example be in the form of a metal strip disposed edgewise-on with respect to the front and rear walls of the envelope. A continuous peripheral wall can be formed from two or more such strips joined, e.g., soldered, end to end. In an alternative construction the or each spacer member is in the form of a metal strip which is bent to provide a flange or flanges which or each of which is parallel with and soldered to the adjacent front or rear envelope wall.

When employing a spacer member or members, such member or members can determine the interior dimension of the envelope between the front and rear walls. Such interior dimension can be substantial enen if the front and rear walls are flat.

The opposed front and rear walls of the envelope may be flat, or one or both of them may form a dome or half-shell. In other words it may be dished over the whole or part of its area. By using a component of half-shell form for the front or rear wall or each of them, an envelope of apreciable internal thickness can be formed without using a peripheral wall component or spacer.

The overall composition of the envelope is open to choice depending on the nature of the product of which it forms part. The envelope of a gas-discharge display device may comprise front and rear glass wall-forming components, but it is not essential for both of these walls to be made of glass. If the envelope is to be activatable by electromagnetic or corpulscular radiation transmitted from the rear of the envelopes then of course the rear wall must be capable of transmitting the radiation in question. In preferred embodiments of the invention the envelope comprises front and rear wall-forming components both made of glass. The use of glass for both components simplifies organization of mass production and avoids problems of selecting soldering conditions to suit components of significantly different composition.

In other embodiments of the invention, the envelope comprises opposed wall-forming components, one made of glass and the other of metal. If such a metal component is employed, preparation of this component for the solder jointing may be unnecessary, depending on the metal. If necessary a suitable coating of another metal or a flux can be applied to the second component at the region of the joint preparatory to soldering. Instead of a metal component a ceramic component can be used or a component of composite structure, . . . one comprising plies of different materials.

One or more of the envelope-forming components may bear one or more coatings for optical or other purposes.

The method according to the invention can be employed in the manufacture of devices for many different purposes. Notable examples are display panels, particularly relatively large panels such as instrument panels for vehicles and other machines and television screens; but also including numeric and other display panels for electrical and electronic instruments such as calculators and time recording devices. The invention can also be employed in the manufacture of solar panels.

Within the broad field of display devices, in the manufacture of which the invention can be employed, there are numerous types functioning on different principles. The following is a list of some of them:

(a) Gas discharge devices comprising a system of electrodes permitting localised break down of gas and light emission responsive to electrical signals distributed across the system in accordance with the required display (b) Vacuum fluorescent devices incorporating cathode ray tubes with phosphor-coated anodic display segments which can be selectively energised by voltage signals (c) Electroluminescent devices incorporating aphosphor layer which is disposed between electrodes and emits a light image responsive to appropriately energizing signals delivered by a scanner (d) Magnetic display devices comprising spherical particles which have light-reflecting and non-light-reflecting aspects and which in any given zone of the device can be moved into light-reflecting display orientation by the action of electromagnetic signals (e) Light-emitting diode devices comprising semiconductors which emit light when fed with electric current (f) Incadescent filament devices disposed in dot array and energisable in display configuration by signalling voltages applied at appropriate positions in the array (g) Photoconductor controlled light-valve devices comprising an electro-optic film emitting display signals responsive to light signals.

Brief descriptions of devices of the foregoing types are to be found e.g. in a report by Alan Sobel entitled "Electronic Numbers" published in Scientific American of June 1973, Volume 228 No. 6; in Proceedings of the IREE, July 1973, pages 907 to 915; in the Record of the IEEE 1976 Biennial Display Conference held 12th to 14th October 1976; and in the Digest of Technical Papers read at the SID International Symposium, published by Lewis, N.Y. (First Edition: May 1976).

Another field of use for the invention is the manufacture of envelopes containing electrical or electronic, e.g. micro-electronic, circuitry. Such circuitry is usually composed of different electrical components such as transistors, resistors, capacitors, amplifiers, etc. connected together by conductor lines. The components and the conductor lines are deposited on a substrate, generally by vacuum deposition techniques for elaborate circuitry or by silk screening techniques for less elaborate circuitry. The circuitry may be deposited on one or more substrates which are introduced into the envelope according to the invention. Instead of or in addition to using a separate substrate or separate substrate(s) the circuitry may be deposited on one or both of the components forming the envelope walls.

Depending on the nature of the elements or materials enclosed in the envelope it is sealed hermetically after withdrawal of air to reduce the pressure in the envelope, or after withdrawal of air and introduction of a gas of special composition. Such evacuation or evacuation and refilling of the envelope may be essential for the eventual function of the device or may be desirable for improving its performance or its life, depending on its nature.

In preferred embodiments of the invention the envelope is sealed to enclose electrical or electronic circuitry elements and one or more insulating layers covering such sheets.

The invention can also be employed for manufacturing an envelope containing one or more solar energy transducers. Such transducers may be constituted by photovoltaic cells. Such cells may for example be formed by silicon discs or based on layers of cadmium.

BRIEF DESCRIPTION OF THE DRAWINGS

Certain embodiments of the invention and various different applications thereof will now be described by way of example and with reference to the accompanying diagrammatic drawings in which.

DESCRIPTION OF SPECIFIC EMBODIMENTS

Figure 1:
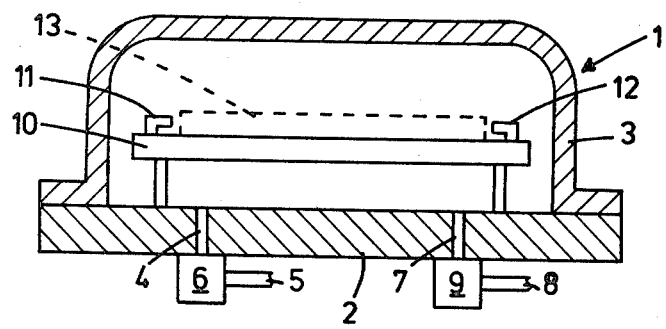
FIG. 1 shows a stage in the manufacture of a gas-discharge display panel according to the invention.

Referring firstly to FIG. 1, the apparatus employed in the illustrated method comprises a vacuum chamber 1 having a base 2 and a removable cover 3 which has a peripheral flange which can be air-tightly clamped to the base 2 by clamping means (not shown). Within the base there is a gas inlet port 4 which is connected to an external feed line 5 by a valve unit 6, and an exhaust port 7 which is connected to an external exhaust line 8 via a valve unit 9.

An article support 10 is mounted on the base and on the margin of support 10 there are electrical resistance heaters such as 11, 12 located so as to surround a display panel 13, shown in broken line, when this is placed on the support.

The display 13 is of the type (a) hereinbefore identified. The principle of operation of such panels and their essential internal construction is known per se and explanation thereof is not necessary for the purpose of describing the illustrated method. This method is concerned with the manufacture of the envelope of the panel. In the present example, the envelope is formed from two flat pieces of glass which form the front and rear walls of the envelope. These pieces have to be gas-tightly jointed together at their margins to enclose the system of electrodes (which are secured to the envelope walls) and the gas discharge medium.

In carrying out the method, the margins of the inner faces of the two pieces of glass were methallized by deposition of a coating of copper using a spraying technique known per se in the metallization of glass components. Then a layer of solder was deposited on the coating of each of the two components. The thickness of each solder deposit was slightly in excess of half the required spacing between the glass sheets in the finished envelope.

The two coated pieces of glass were then assembled with their solder layers in contact and the assembly was placed on the support 10. The cover 3 of the vacuum chamber was then clamped to the base 2. While the inlet valve 6 was closed, air was exhausted from the interior of the chamber by opening the valve 9 and operating a vacuum pump (not shown) connected to exhaust line 8. The pump extracted air from the space surrounding the panel assembly 13 and, because those components had not yet been sealed together, also from the space within the envelope of that assembly.

When the chamber and envelope had been evacuated as indicated by a pressure gauge (not shown), the exhaust valve 9 was closed.

The feed line 5 was connected to a source of gas for filling the gas discharge panel assembly 13, and the inlet valve unit 6 was opened to admit that gas into the chamber and to the interior of the envelope. The gas admitted into the chamber is maintained within the chamber at the pressure required inside the display device, as indicated by the pressure gauge. This pressure is usually below atmospheric pressure. This pressure is maintained for a time sufficient to ensure that the required pressure is established inside the device. The device is then sealed by a heating circuit incorporating the resistance heaters 11, 12 which was switched on so as to cause fusion of the solder in situ by radiant heat. Heating of the display panel was substantially confined to its peripheral region. Once an appropriate fusion temperature has been reached the resistance heaters were switched off. After allowing sufficient time for the solder to cool and set to form a continuous peripheral air-tight joint, air was admitted into the chamber by opening valve 6, and the cover 3 of the vacuum chamber was then removed.

The exhaustion of air from the envelope and the subsequent entry of the replacement gas is made very easy by the fact that gas can flow between the contacting layers of solder at all positions along the periphery of the envelope assembly.

Of course if the device 13 is of a type which is to be filled with air at low pressure, then the pressure within the chamber 1 is merely reduced to the required value as indicated by the gauge (not shown), prior to closing of the exhaust valve 9 and sealing as described above.

In a modification of the above described method, solder was applied to only one of the two pieces of glass prior to the assembly of the components, the solder being applied to form a layer having a thickness slightly in excess of the required spacing between the front and rear walls of the finished envelope. The excess thickness required to allow for the reduction of the inter-sheet spacing which occurs when the solder melts can be determined empirically on the basis of tests.

In order to ensure a precise predetermined spacing of the two pieces of glass in the finished envelope, spacer elements can be placed between the margins of the sheets, e.g. at spaced local positions, and a weight may be placed on the assembly to ensure that the pieces of glass both come into contact with the spacer elements when the solder melts.

In a further modification of the method described with reference to FIG. 1 strips of solder were placed in position so as to be sandwiched between the two pieces of glass on assembly thereof. The heating of the margins of the assembly caused fusion of the solder to form a continuous gas-tight joint which was as effective as the joint formed from the solder coatings in the method above described.

In a further modification of the method described with reference to FIG. 1 the two pieces of glass for forming the front and rear walls of the envelope were jointed (but not hermetically sealed) together before introducing the assembly of components into the vacuum chamber. The heating means within the chamber comprised small radiant heaters located so as to confine the heating effect to the said local zones. The radiated heat fused the solder in those zones so that the joint was made continuous, thereby hermetically sealing the envelope.

The method as described can of course be employed for sealing envelopes of different form and/or of different compositions, e.g. envelopes comprising a front wall-forming component made of glass and a rear wall-forming component made of another material, e.g. metal. In the latter case, metallisation of the rear-wall forming component prior to application of solder can be omitted if the material of which the component is formed is adequately adherent to the solder employed.

The in situ fusion of the solder can equally well be performed by a high-frequency induction heating unit which is displaceably mounted within the chamber 1 so that it can be displaced along the sandwiched solder layer(s). The displacement of the unit can be effected by electrical relays energized from a voltage source outside the chamber.

Another heating method which can be employed for melting the solder is by heat conduction from a soldering iron or irons. The irons can be mounted on rails extending along the margins of support 10 and be displaced along the margins of the envelope assembly by electric motors. The mechanization of soldering is known per se in the soldering of other kinds of work and therefore does not require further description. The use of one or more soldering irons is especially suitable in the case that fusion of solder while the envelope assembly is in the chamber 1 has only to take place at one or a small number of local zones for converting a discontinuous joint, formed outside the chamber, into a continuous gas-tight joint.

Reference will now be made to FIGS. 2 to 5.

Figure 2:
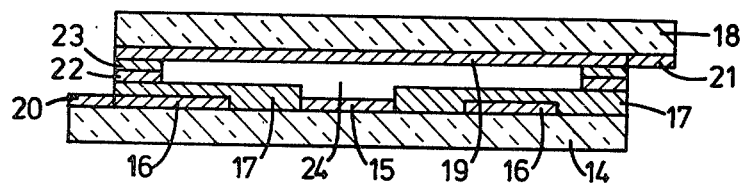
FIG. 2 is a cross-section of another device prepared ready for treatment in a chamber by a method according to the invention.

FIG. 2 shows details of an assembly for components for forming a gas-discharge display device, the assembly being ready for evacuation and sealing in accordance with the present invention. The rear wall-forming component of the envelope is a glass sheet 14 which carries printed circuit components including electrodes 15 (only one of which is shown), constituting display elements, and associated conductor lines 16. The electrodes 15 may constitute segments of an array of digits for numeric display purposes. Such electrodes may be deposited for example by cathodic sputtering. The electrode material may for example be selected from: nickel, aluminium, titanium, chromium, nickel-chromium alloys, gold, tin oxide and indium oxide.

The printed side of the glass sheet 14, except in areas occupied by the display elements 2, is covered by an electrically insulating layer 17. The insulating layer is preferably formed of one or more oxides for example an oxide or oxides of one or more of the elements: zirconium, silicon, chromium and titanium. Layers of such composition have very good insulating properties. Such layers may e.g. have a thickness of several microns. Instead of a metal oxide insulation, a low-melting vitrifiable enamel composition can be used. It can be applied as a paste through a suitable stencil which makes the display elements 15, the composition being subsequently heated to bring about its vitrification. The elements 15 can be suitably protected from oxidation by protective coatings during the vitrification step. For ensuring adequate insulation, such an enamel insulating layer will usually require to have a thickness exceeding 10 microns.

The front wall-forming component of the envelope is a glass sheet 18 the inner face of which is covered by an electrically conductive layer 19 constituting the counter-electrode. The size and position of the glass sheet 18 in relation to the sheet 14 is such that in the assembly, end portions of the conductor lines 16 are exposed at the periphery of the assembly to form terminals such as 20, and a portion of the counter-electrode 19 is exposed at a margin of the assembly to form a terminal 21. Depending on which of the display elements 15 are fed with voltage signals at any given time electrical discharges occur in corresponding regions to create a light image which is visible through the front wall of the envelope. The conductive layer 19 may for example be formed of tin oxide, indium oxide, cadmium oxide or cadmium stannate.

In the manufacture of the device, the inner faces of the glass sheets 14 and 18, after being coated as above described, are metallized on their margins by application of copper (not shown), as hereinbefore referred to. Then the metallized margins of the sheets 14 and 18 are covered by solder layers 22, 23 respectively, preferably using tin/lead solder. Such solder can be deposited in a variety of ways, e.g., by extruding molten solder from an extrusion type applicator as it is displaced along the sheet margin, or by applying solid strips of solder on top of the metallizing coatings and heating such solder strips to cause them to adhere by fusion to the substrates. It is especially suitable to use a solder containing by weight, 63% tin and 37% lead.

The two sheets are then assembled as shown in the drawing with the solder deposit(s) sandwiched between them and the assembly is introduced into a vacuum chamber in which the pressure is then reduced to a low value. Subsequently a quantity of neon gas is introduced into the chamber in a quantity sufficient to bring the neon partial pressure to about 30 mm of mercury. As the envelope has not yet been sealed, its interior space 24 becomes filled by gas of the same composition and pressure as that occupying the chamber space externally of the envelope. Then the assembly is heated in the chamber sufficiently to cause fusion of the solder layers 22, 23. The melting point of the solder used (63% tin, 37% lead by weight) is 183° C. and it is desirable to heat the solder sufficiently above this temperature so that it can flow readily. A temperature of say 200° to 210° C. is suitable. Heating too much, e.g. above 250° C. is uneconomic both in energy and time. On cooling, the solder solidifies and forms an hermetic seal between the two glass sheets. The pressure in the chamber is subsequently increased to atmospheric and the completed envelope is then removed from the chamber.

During the heating step whereby the solder is melted between the margins of the glass sheets, the envelope assembly may be subjected to pressure by external means, e.g. by a weight placed on the assembly. If desired the chamber may carry means which projects into the interior of the chamber and exerts elastic pressure on the envelope assembly as it is inserted into the chamber or when the chamber is subsequently closed.

In an alternative to the foregoing procedure the solder deposit(s) on the coated glass sheets can be fused after assembling the sheets but prior to insertion of the assembly into the vacuum chamber provided that the peripheral seal is interrupted at one or more locations via which the interior of the envelope will be in communication with the interior of the vacuum chamber when the assembly is placed therein. That interruption can be ensured by leaving the sheets without solder deposit at one or more locations along the margin of the assembly or by leaving the solder deposit(s) unfused at one or more such locations. After placing the assembly in the vacuum chamber and establishing the requisite gas composition and pressure within the envelope, the peripheral sealing of the envelope can be completed, while the envelope remains in the vacuum chamber, by local or overall reheating of the solder to fusion temperature. In yet another method they are dip-soldered together externally of such chamber to form a solder joint which is interrupted e.g., at a corner of the envelope, and after the envelope has been filled with gas of the required composition and pressure in the vacuum chamber the envelope is locally heated to complete the seal. By way of modification of that procedure, a complete peripheral solder joint can be formed externally of the vacuum chamber and the seal can be pierced locally prior to exposure of the envelope to the lower pressure conditions in the vacuum chamber.

Figure 3:
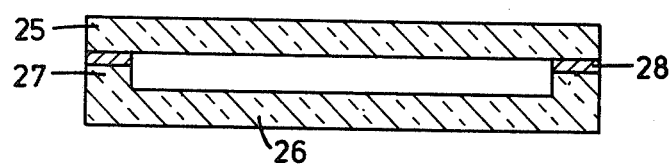
FIGS. 3 to 5 are cross-sections of three further forms of envelope which may be manufactured by a method according to the invention.
Figure 4:
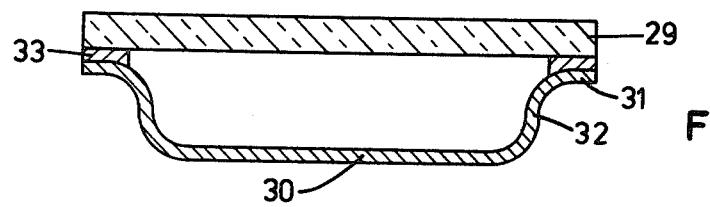
Figure 5:
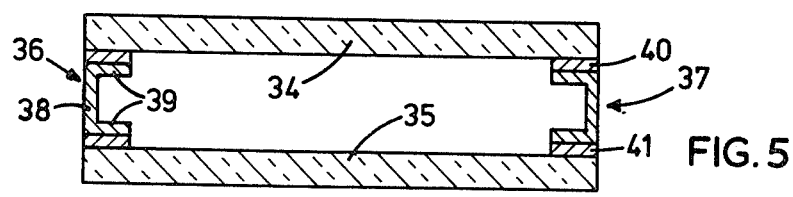

Reference will now be made to FIGS. 3 to 5 illustrating further forms of envelopes which can be sealed by a method according to the invention. The envelopes can enclose elements of various kinds according to the type of the device to be manufactured, e.g. according to whether the device is a solar panel, or a display device. Since the purpose of the figures is merely to show different forms of envelope, the internal elements have been omitted.

FIG. 3 shows an envelope which comprises a flat glass component 25 and a glass component 26 having a raised peripheral wall of flange 27. The two components are hermetically jointed by means of a solder layer 28 sandwiched between the inner face of sheet 25 and the edge face of the flange 27.

The display and/or other interior elements (not shown) serving in the function of the device may be carried by component 25 or component 26 or in part by one and in part by the other of such components.

The envelope illustrated by FIG. 4 comprises a flat glass component 29 forming a rear wall of the envelope and a component 30, also of glass, which forms the front wall of the envelope. The component 30 is of dished form including a peripheral flange 31 and a peripheral wall portion 32 extending between that flange and the central flat portion of the component. The two components are jointed together by means of a solder layer 33 disposed between the inner face of component 29 and the flange 31 of component 30. The solder joint hermetically seals the envelope. The display and/or other interior elements (not shown) serving in the display or other function of the device may be carried by component 29 and/or component 30. In a modification, a metal plate is employed instead of the glass component 29 for forming the rear wall of the envelope.

The envelope represented in FIG. 5 is formed by two flat rectangular glass sheets 34 and 35 forming front and rear walls of the envelope and intervening metal spacer strips 36 and 37. Each of the strips 36 and 37 is bent to form a right angle at one position along its length so that the strips are of L-shape viewed in plan and the limbs of each "L" lie along two contiguous margins of the rectangular sheets. The strips are joined end to end to form a rectangular frame. Each of the spacer strips is of U-shaped cross-sectional profile comprising a web joining two parallel flanges. The web of strip 36 is marked 38 and its flanges are marked 39. The flanges of the two strips are soldered to metallic deposits (not shown) on the margins of the sheets 34, 35 by solder layers 40, 41.

It has been found to be advantageous to precoat the spacer strips 36, 37 with solder as well as the margins of sheets 34, 35 before assembling the said sheets and spacer strips. Pre-coating of the spacer strips with solder can be effected by dipping the strips in a bath of molten solder. The solder coating on the strips may for example have a thickness of between 2 and 50 microns. The thickness of the solder deposits on the sheet margins can e.g. be between 50 and 200 microns.

By way of modification of the method of envelope manufacture described with reference to FIG. 5, precoating of the sheets 34, 35 and the spacer strips 36, 37 prior to assembly of these components can be dispensed with and discontinuous joints between the sheets and the spacer strips can be formed, prior to introducing the assembly into the vacuum chamber, by projecting a jet or jets of molten solder against the edges of the assembly so that the solder forms a solder bead or beads between that spacer strip and the internal faces of the projecting margins of the glass sheets. Excess solder can be wiped from the edge of the unit in a subsequent step. Some of such solder may penetrate between the flanges 26 of the spacer strips and the glass sheet.

As an alternative, such a solder jet technique can be applied in addition to pre-soldering of the components prior to assembly. In that case the jet or jets of molten solder subsequently applied to the edges of the assembly can serve to melt the solder deposits applied prior to assembling the components.

We claim:

1. In a method of manufacturing an envelope which includes a vitreous wall assembled to at least one other wall-forming component, said method comprising the steps of applying said vitreous wall to said other wall-forming component with interposition of a bonding medium to form at least one continuous peripheral joint between them, thereby forming an assembly; introducing said assembly into a hermetically sealable chamber; withdrawing air from the chamber and establishing non-atmospheric gaseous conditions in said chamber to obtain such conditions within the assembly and then hermetically sealing the assembly within said chamber under said non-atmospheric gaseous conditions to form said joint, the improvement comprising depositing at least upon said vitreous wall before the step of applying the same to the other wall-forming component a metallic coating along the zone where said bonding medium is to bond such component, the improvement further comprising the use of solder as the bonding medium to form the continuous peripheral joint and fusing the solder to form the joint by heat generated within the chamber and in the vicinity of said peripheral joint.

2. A method according to claim 1, characterised in that all of the solder which is required for forming the continuous peripheral joint is present as part of the assembly which is prepared for enclosure in the chamber.

3. A method according to claim 2, characterised in that in said assembly prepared for enclosure in the chamber, the solder is present as one or more deposits extending along the continuous course of the joint which is to be formed.

4. The method according to claim 3, characterised in that the solder deposit forms an adherent coating.

5. A method according to claim 1 characterised in that all of the solder which is required for forming the continuous peripheral joint is present as part of the assembly which is prepared for enclosure in the chamber and characterised in that the peripheral joint is or are formed at least substantially entirely within the chamber.

6. A method according to claim 1 characterised in that all of the solder which is required for forming the continuous peripheral joint is present as part of the assembly which is prepared for enclosure in the chamber and characterised in that the envelope-forming components are soldered together before being enclosed in the chamber but so that there is a discontinuous solder joint, and in that this joint is completed within the chamber.

7. A method according to claim 1 characterized in that all of the solder which is required for forming the continuous peripheral joint is present as part of the assembly which is prepared for enclosure in the chamber and characterised in that the heating of solder within the chamber is effected by electrical heating means.

8. A method according to claim 1, characterised in that the solder employed has a melting temperature below 350° C.

9. A method according to claim 1, characterised in that the envelope-forming components comprise front and rear vitreous components for forming front and rear walls of the envelope.

10. A method according to claim 1, characterised in that the assembly of envelope-forming components prepared for introduction into the chamber encloses elements which together with said envelope form a gas-discharge display device when the envelope is sealed.

11. A method according to claim 1, characterised in that the assembly of envelope-forming components prepared for introduction into the chamber encloses electrical or electronic circuitry elements and at least one insulating layer covering such elements.

* * * * *